United States Patent [19]

Hupp et al.

[11] Patent Number: 5,844,938
[45] Date of Patent: Dec. 1, 1998

[54] CARRIER BASED DATA OPERATED SQUELCH

[75] Inventors: Mark R. Hupp, Lincoln; Kenneth L. Snyder, Elmwood; Douglas E. Ehlers, Lincoln, all of Nebr.

[73] Assignee: Transcrypt International, Inc., Lincoln, Nebr.

[21] Appl. No.: 690,902

[22] Filed: Aug. 1, 1996

[51] Int. Cl.$^6$ .................................................. H04L 27/18
[52] U.S. Cl. ........................ 375/217; 375/326; 375/329; 375/360; 455/212; 455/218; 329/304
[58] Field of Search .................................. 375/351, 216, 375/217, 326, 329, 360; 455/212, 218; 329/304, 310

[56] References Cited

U.S. PATENT DOCUMENTS 4,450,573   5/1984   Noble ........................................ 375/351
4,455,664   6/1984   Burke ........................................ 375/351

*Primary Examiner*—Amanda Le
*Attorney, Agent, or Firm*—Zarley, McKee, Thomte, Voorhees & Sease

[57] ABSTRACT

A method for providing improved carrier based data operated squelch (CDOS) includes routines for recovering the carrier signal and for analyzing the received signal. The received signal is sampled at each transition point of the carrier signal as well as the halfway points between the transition points. In addition, extra samples are taken between these samples. Using the samples, a carrier locked loop routine recovers the carrier signal. A CDOS routine analyzes the extra samples to determine the presence of data. If two successive samples are different, this means that a transition has occurred. The CDOS routine analyzes these transitions to determine whether the input signal is encoded with data. If the CDOS routine determines that the input signal is encoded with data, a CDOS counter is incremented. As the input continues to look like data, the value by which the CDOS counter is incremented is increased. When the CDOS counter reaches a certain threshold, the CDOS mutes the output circuit.

17 Claims, 6 Drawing Sheets

CARRIER BASED DATA OPERATED SQUELCH

BACKGROUND OF THE INVENTION

A. Field of the Invention

The present invention relates to phase shift keyed (PSK) digital signal communications. More particular, though not exclusively, the present invention relates to a method and apparatus for providing improved carrier based data operated squelch (CDOS).

B. Problems in the Art

Carrier based data operated squelch (CDOS) is used in communication systems that use phase shift keyed (PSK) digital signals to transmit data packets over a channel that is also used for analog communications. A typical PSK encoded signal is encoded primarily with an analog communication signal but also includes short bursts or packets of digital data. When receiving and playing back encoded PSK digital signals encoded with data packets, it is desirable to mute the output circuit so that the user will not have to listen to the data. The primary use of CDOS is to mute the output circuit when the data is received so that the user does not have to listen to the data. A CDOS system is designed to recognize data packets and then to mute or squelch the output circuit while the data is present.

Existing systems for recognizing data packets are bit data operated squelch (BIT DOS) and CDOS. Both of these existing data recognition schemes encounter problems. A BIT DOS system is prone to occasionally detect data when in fact there is no data. This results in muting the receiver when it is not supposed to be muted. Attempts to make prior art systems immune to falsing leads to unacceptably slow response times to data packets. A typical BIT DOS is described in U.S. Pat. No. 4,450,573 issued on May 22, 1984. This prior art BIT DOS system uses a carrier locked loop and a bit locked loop to decode the input signal bit by bit. A typical prior art CDOS system is described in U.S. Pat. No. 4,455,664 issued on Jun. 19, 1994. A typical CDOS system uses a carrier locked loop and is concerned with the transitions of the input, or when the signal goes from high to low or low to high. Prior art CDOS systems look for transitions within a very narrow time frame. Because of this narrow time frame, this prior art approach is unacceptable and therefore undesirable.

It can therefore be seen that there is a need for a data recognition system which is less likely to be set off by nondata input and also can recognize data very quickly without sacrificing immunity to falsing. It is also desirable to have a data recognition system that provides for fast and reliable recognition of data.

Therefore there is room for improvement in the art. The present invention represents an improvement over the state of the art.

C. Features of the Invention

A general feature of the present invention is the provision of an improved carrier based data operated squelch which overcomes problems found in the prior art.

A further feature of the present invention is the provision of an improved CDOS which samples an encoded signal frequently and over a wide time frame and recognizes data by analyzing these frequent samples.

A further feature of the present invention is the provision of an improved CDOS which uses a counting routine to recognize data more quickly and more accurately than systems of the prior art.

Further features and advantages of the present invention include:

An improved CDOS which samples an encoded signal at each transition time, at times between each transition time, and at times between these times.

An improved CDOS which recognizes data by analyzing the samples immediately following the transition samples.

An improved CDOS which is faster and more accurate than data recognition systems of the prior art.

These as well as other objects, features and advantages of the present invention will become apparent from the following specification and claims.

SUMMARY OF THE INVENTION

The present invention relates to a method for identifying data in a phase shift keyed digital signal encoded with data. The encoded signal is sampled with some of the samples being taken at the transition points of the encoded signal. Based on the samples, a carrier reference signal is determined. A CDOS routine analyzes the sample data by creating an XOR buffer and determining the presence of data based on whether the contents of the XOR buffer are indicative of data. When the contents of an XOR buffer are indicative of data, a counter is incremented. When the counter is incremented to a threshold value, the output circuit is muted.

DETAILED DESCRIPTION OF THE PREFERRED EMBODIMENT

The present invention will be described as it applies to its preferred embodiment. It is not intended that the present invention be limited to the described embodiment. It is intended that the invention cover all alternatives, modifications, and equivalences which may be included within the spirit and scope of the invention.

Figure 1:
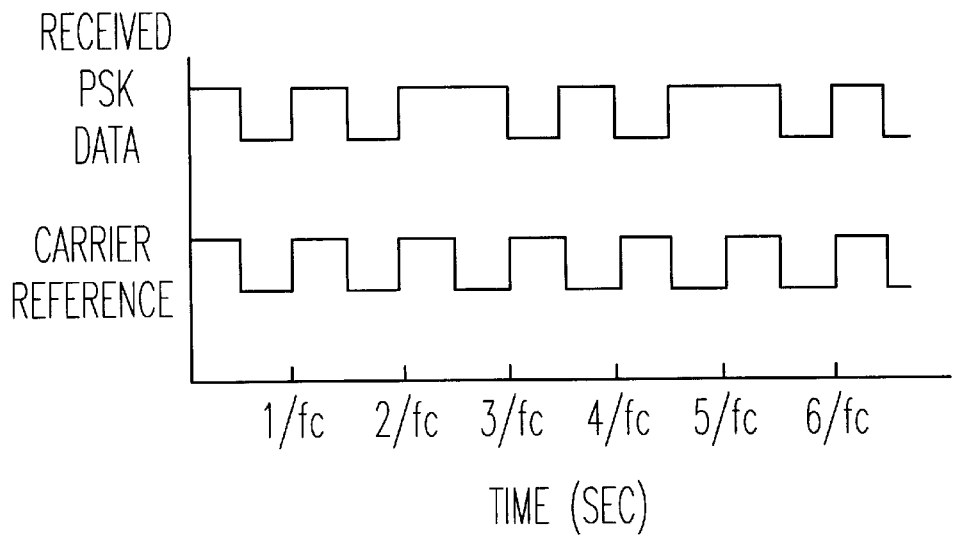
FIG. 1 shows a limited received PSK data signal and the carrier reference signal.
Figure 2:
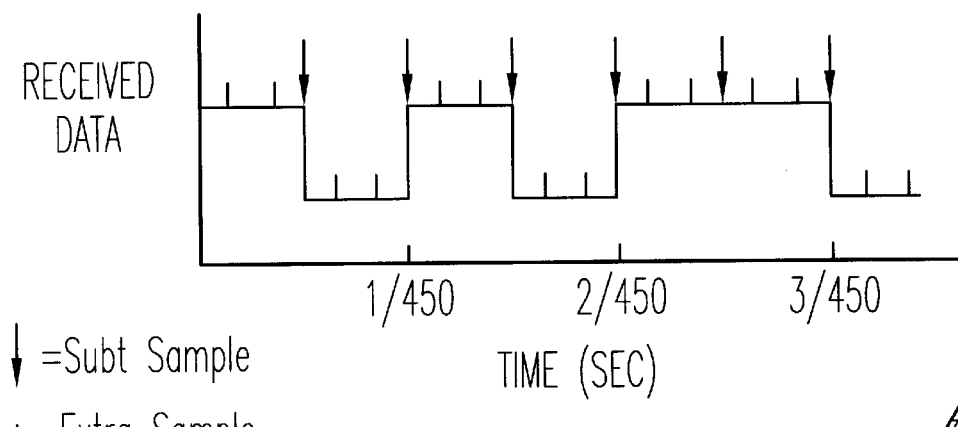
FIG. 2 shows the received PSK data signal including the subt samples and the extra samples.

The present invention is used in two-way audio communications systems that use phase shift keyed (PSK) digital signals to transmit data packets over a channel that is also used for analog communications. An analog signal is encoded on a carrier signal using PSK and sent to a receiver. Data packets are also occasionally sent to the receiver over the same carrier signal. FIG. 1 shows a received and limited phase shift keyed (PSK) data signal. FIG. 1 also shows a carrier reference signal. The carrier reference signal is generated from the received PSK data signal. A carrier locked loop is used to generate the carrier reference signal by lining up the transitions of the data signal with the transitions of the carrier reference (discussed below). In this example, the carrier signal has a frequency $F_c$ of 450 Hz. FIG. 2 shows the received PSK encoded signal showing the subt and the extra samples (discussed below).

Figure 3:
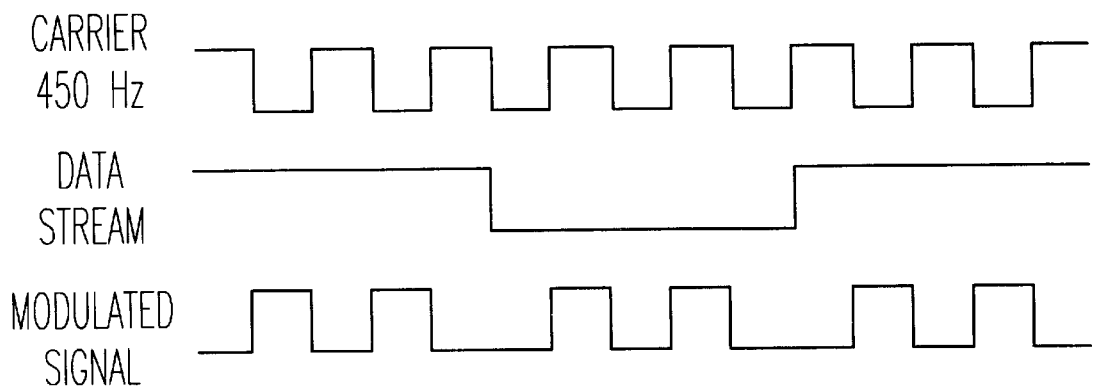
FIG. 3 shows the carrier signal, the data stream signal, and the modulated signal.

At the transmitter, a binary input data stream is modulated on a carrier signal. This is accomplished using phase shift keying. In the example shown in FIG. 3, the input data stream operates at a rate of 180 bits per second. The square wave carrier has a frequency of 450 Hz. As can be seen, each bit of unencoded data lasts for five half-cycles of the carrier wave. To modulate the data signal onto the carrier wave, the phase of the carrier wave is changed whenever the data stream changes from one to zero or zero to one. The data is converted to a phase shift keyed (PSK) signal by taking the exclusive OR (XOR) of the carrier and the data stream. This creates a PSK modulated signal which has a phase shift whenever the data stream changes from zero to one or from one to zero. The modulated signal is also shown in FIG. 3. The resulting modulated signal is then bandlimited and transmitted. At the receiver, the modulated PSK signal is filtered by a 600 Hz lowpass filer and limited. The limited signal will ideally look like the original modulated signal shown in FIG. 3. The modulated signal is fed into a microcontroller which runs carrier locked loop and CDOS routines which are described below.

Figure 4:
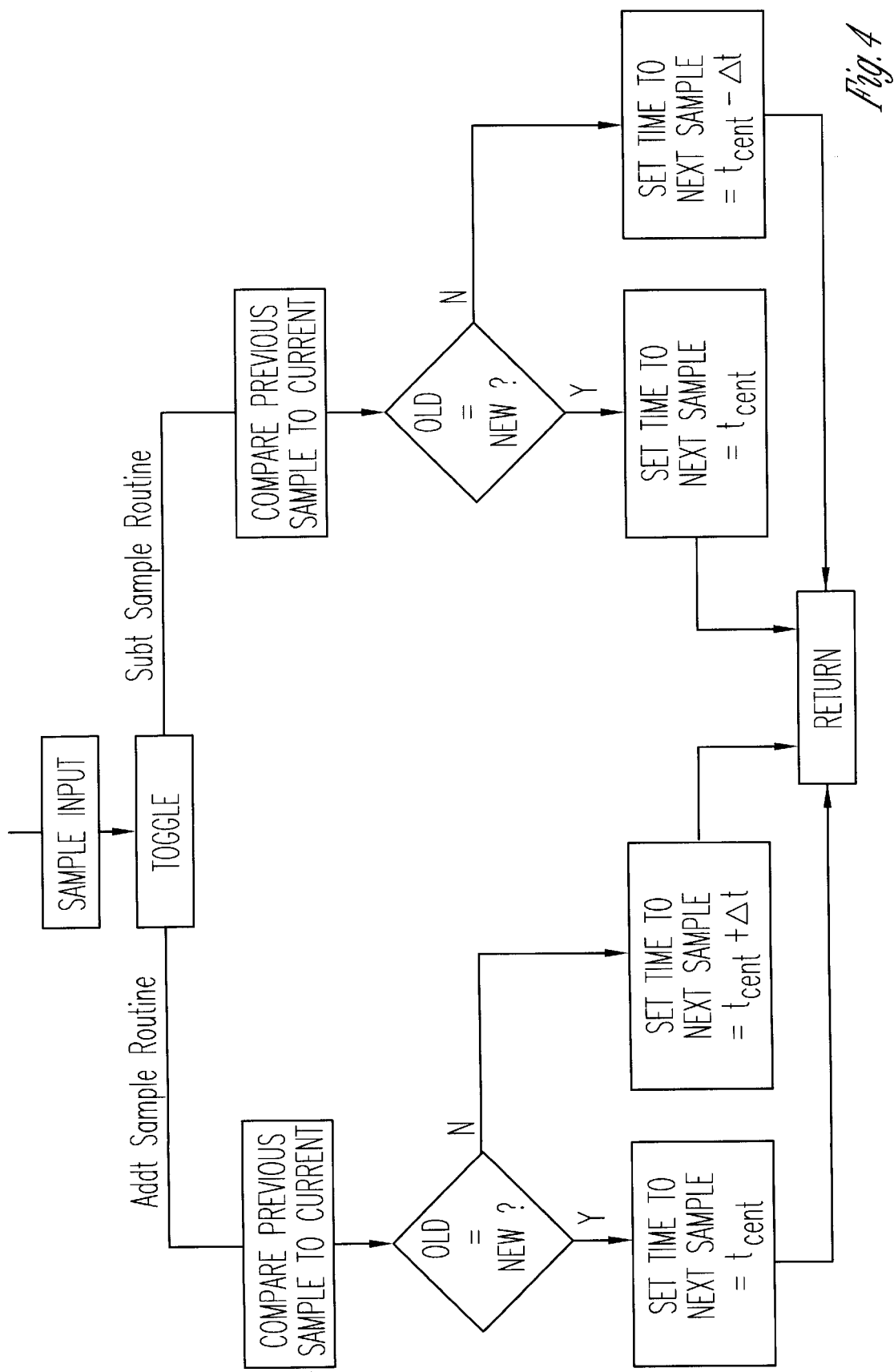
FIG. 4 shows a flow chart of the carrier locked loop.

At the receiver, the microcontroller must first recover the carrier signal from the modulated signal. This is accomplished using a carrier locked loop. FIG. 4 is a flow chart of the carrier locked loop. The modulated input signal is sampled at a rate of four times per cycle of the carrier to recover the carrier signal. The carrier locked loop positions two of these samples (designated subt samples) at the transition points of the input signal. The other two samples are positioned in the center of each half cycle of the carrier signal between the transition (designated addt samples). The addt and subt samples are positioned precisely where desired by changing the amount of time between the samples. Nominally, the time between each sample (tcent), is $1/1800$ seconds. This corresponds to $1/4$ of a cycle of the carrier frequency, where the carrier frequency is 450 Hz.

As shown in FIG. 4, the carrier locked loop toggles between addt samples and subt samples. During the addt routine (the left side of FIG. 4) if the current sample is not the same as the previous sample, a $\Delta t$ (~tcent/20) is added to tcent to determine when the next sample is taken. The addt routine is accomplished by comparing the previous sample to the current addt sample. If the previous sample is equal to the current sample, the time to the next sample is set to tcent. If the old sample is not equal to the new sample, the set time to the next sample is tcent+$\Delta t$, in other words, the time before the next sample is increased. Similarly, in the subt routine, $\Delta t$ is subtracted from tcent if the current sample is not the same as the previous sample. As shown on the right side of FIG. 4, in the subt routine the current subt sample is compared to the previous sample. If the previous sample is equal to the current subt sample, the time set to the next sample is tcent. If the previous sample is not equal to the current sample, the time set to the next sample is tcent−$\Delta t$, in other words, the time until the next sample is decreased. Using the carrier locked loop to determine where the transition points of the received signal are, a carrier reference signal can be generated.

Figure 5:
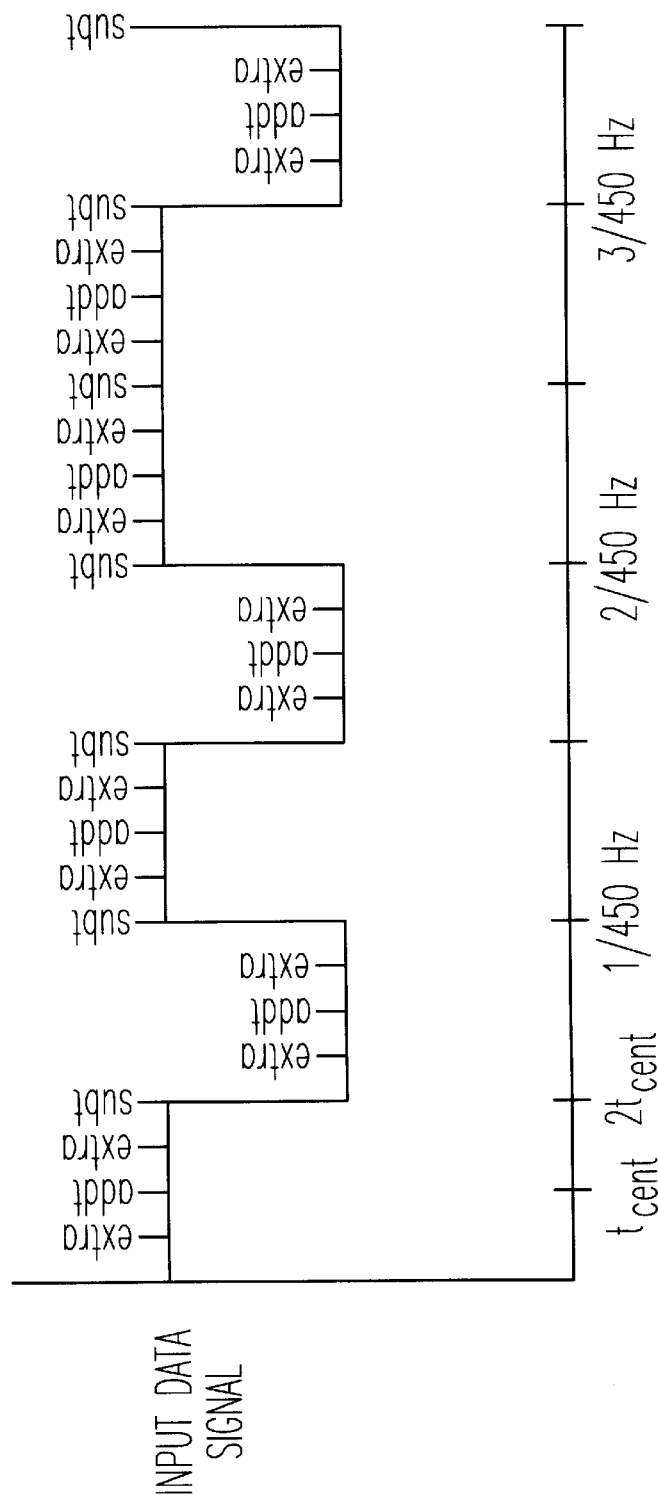
FIG. 5 shows the input data signal with the addt, subt, and extra samples.
Figure 6:
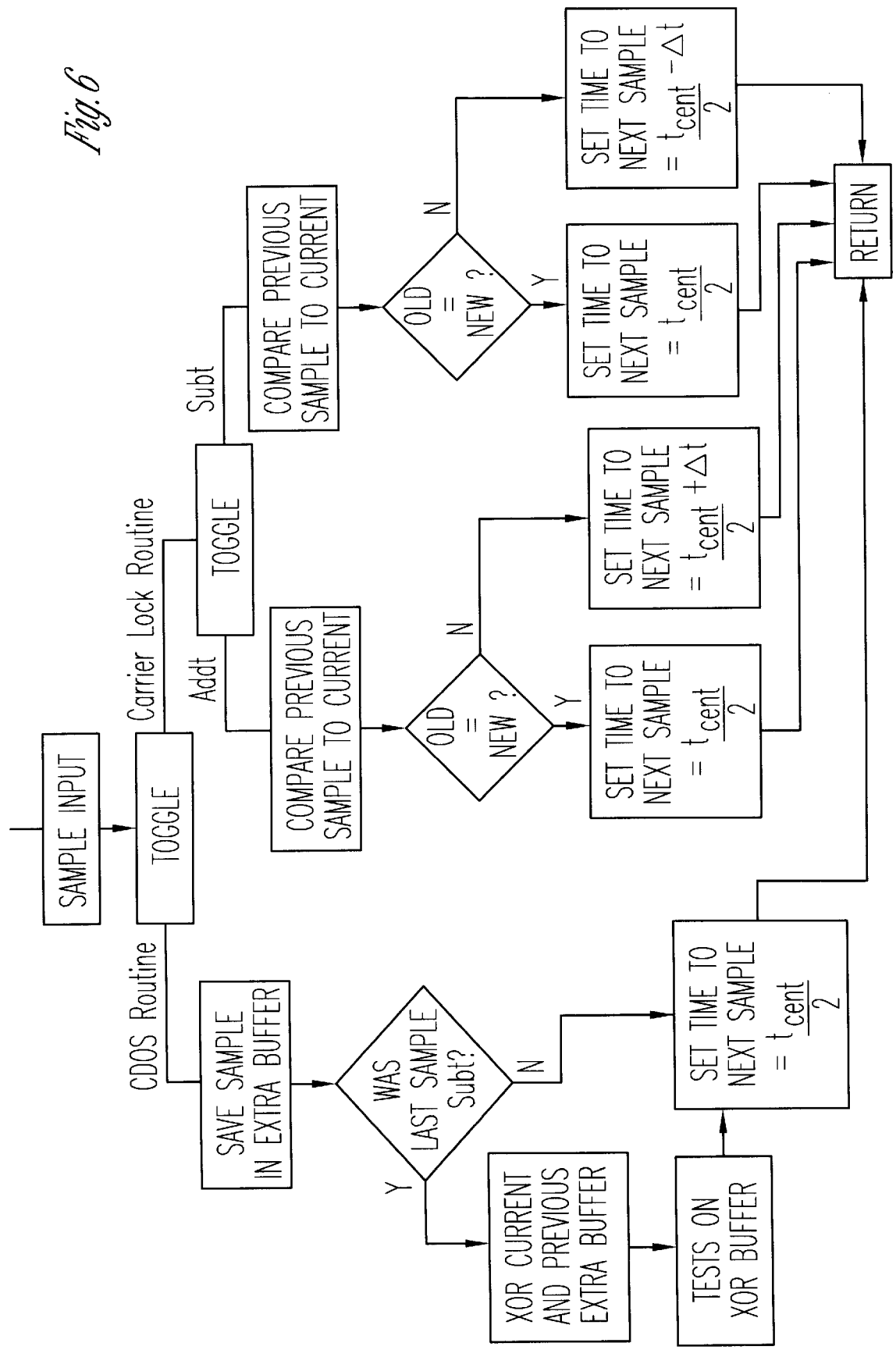
FIG. 6 shows a flow chart of how the CDOS routine and the carrier locked loop are implemented together.

The improved CDOS routine of the present invention takes an extra sample half-way between each addt and subt sample. FIG. 5 shows the input encoded data signal with the addt, subt, and extra sample times labeled. As shown in FIG. 5 and discussed above, the subt samples are taken at the transition points of the signal while the addt samples are taken between the subt samples. An extra sample is also taken between each subt and addt sample. This results in a sample being taken at a rate of eight times per carrier cycle, or at a frequency of eight times the carrier frequency. FIG. 6 shows a flow chart of how the CDOS routine and carrier locked loop (shown in FIG. 4) are implemented together. The time between each sample is now nominally every tcent/2 seconds. Generally, if two successive samples are different, for example high and low, this means that a transition has occurred. The improved carrier based data operated squelch (CDOS) analyzes these transitions to determine whether the input signal is encoded with data (discussed below). If the improved CDOS determines that the input signal is encoded with data, a CDOS counter is incremented. As the input continues to look like data, the value by which the CDOS counter is incremented is increased. When the CDOS counter reaches a certain threshold, the CDOS turns on and mutes the output circuit. The output circuit is muted until data is no longer present.

As shown in FIG. 6, the process toggles between the CDOS routine (shown on the left part of FIG. 6) and the carrier lock routine (shown on the right part of FIG. 6). The carrier lock routine functions as described above and shown in FIG. 4 with one difference. The difference is that before implementing the CDOS routine, the time to the next sample is now tcent/2±$\Delta t$ where in FIG. 4 the time was tcent±$\Delta t$. This change is due to the fact that twice as many samples are now taken. When the process shown in FIG. 6 toggles to the CDOS routine, an extra sample is taken. The extra sample is first stored in a buffer, referred to as the extra buffer. The extra buffer contains the five most recent extra CDOS samples (the samples taken between the addt and subt samples). As shown in FIG. 5, five extra samples will span approximately one and one-quarter cycles of the carrier signal. The next step shown in FIG. 6 is to determine whether the last sample was a subt or an addt sample. If the current extra sample occurred after an addt sample, then the time to the next sample is set to tcent/2 and the process toggles to the carrier locked routine. If the current extra sample occurred after a subt sample, then the four most recent extra samples in the extra buffer are each exclusive OR'd with the extra sample taken immediately before it. This results in an XOR buffer that is four elements long. The XOR buffer contains the necessary information to determine if transitions have occurred between any of the last five extra samples. The XOR buffer is used to recognize data encoded on the carrier signal, as described below. Finally, the time to the next sample is set to tcent/2. The process then toggles to the carrier locked routine described above.

The XOR buffer generated by the CDOS routine described above is analyzed to determine whether the modulated signal is encoded with data. The initial packet of data in existing systems begins with maximum phased shift data (the corresponding bits are 10101 . . . ). The resulting modulated signal will change phase at every five half cycles which corresponds to one bit of data. This is shown best in FIG. 3. If the modulated input signal is data during a non-phased shift time, the extra buffer will contain 11001 or 00110. The XOR buffer described above is created by taking the XOR of the extra buffer with the extra buffer shifted once to the right:

Extra buffer=>00110

Extra buffer shifted=>0011

Resulting XOR buffer=>0101

Figure 7:
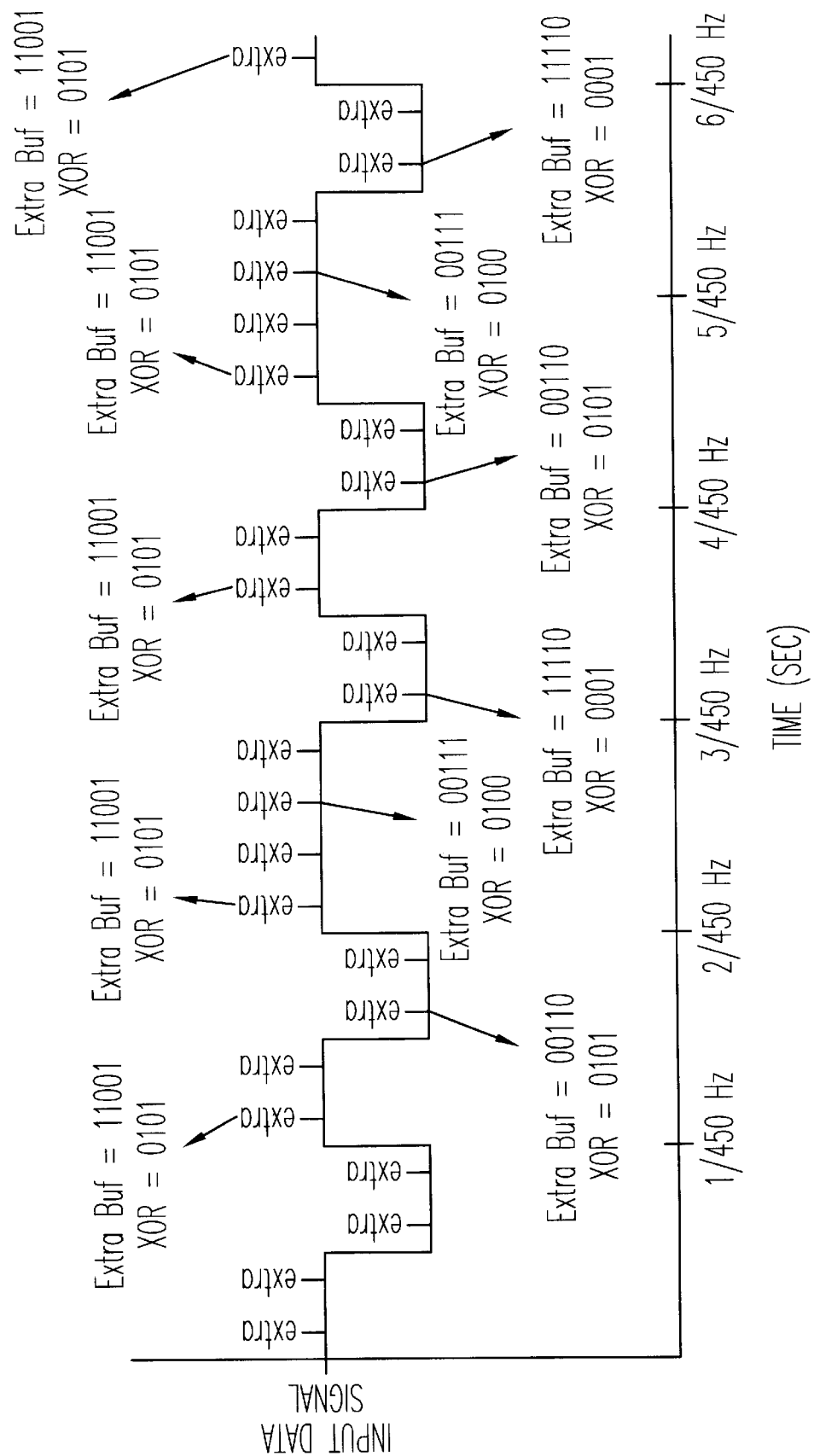
FIG. 7 shows the input data signal including the extra samples and the values of the extra buffer and exclusive OR buffer.

In this example, the XOR buffer (0101) indicates that the extra samples were SAME-DIFFERENT-SAME-DIFFERENT (0101) since an XOR results in a zero when the inputs are the same and a one when the inputs are different. When a phase shift is present, the XOR buffer will first have the sequence 0100 (SAME-DIFFERENT-SAME-SAME). The following XOR buffer will have the sequence 0001 (SAME-SAME-SAME-DIFFERENT). With the maximum phase shift as an input, the CDOS routine will see three XOR buffers of 0101 (SAME-DIFFERENT-SAME-DIFFERENT) sequences, followed by a 0100 (SAME-DIFFERENT-SAME-SAME) and a 0001 (SAME-SAME-SAME-DIFFERENT) for each bit transmitted. This pattern repeats over and over for maximum phase shift data. FIG. 7 shows the input signal indicating the extra samples. Also shown in FIG. 7 are the contents of the extra buffer and XOR buffer which are created at the extra samples which follow a subt sample. Of course, the present invention could be practiced by looking at more or less than the five most recent samples.

The present invention uses the contents of the XOR buffer to determine if the input signal is encoded with data. If the input signal looks like data, a CDOS counter is incremented. When the CDOS counter reaches a certain turn on threshold, CDOS turns on and mutes the output circuit so the user of the present invention does not have to listen to data. The CDOS will keep muting the circuit until the input no longer looks like data.

Figure 8:
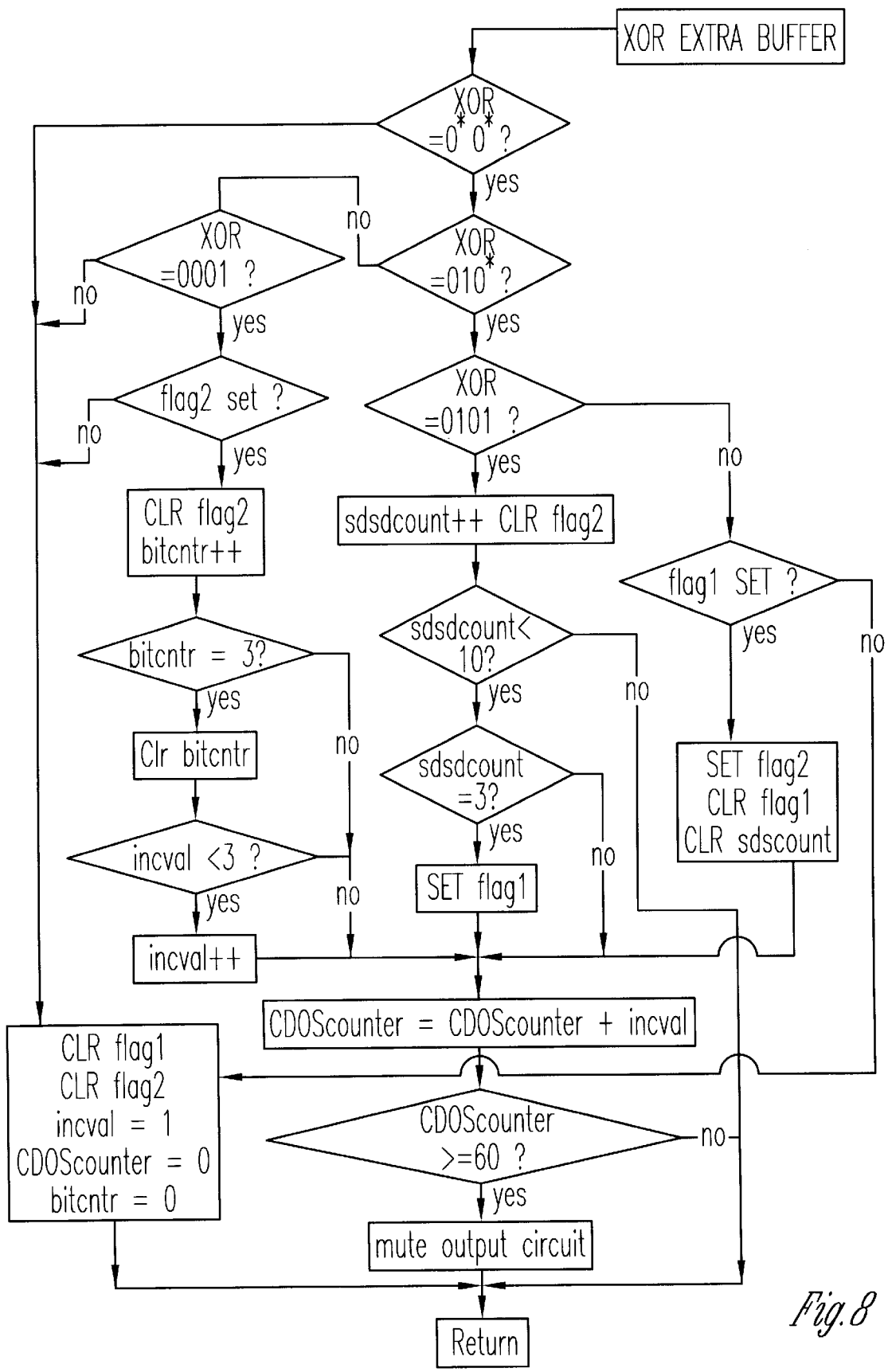
FIG. 8 shows a flow chart of how the exclusive OR buffer is analyzed.

FIG. 8 is a flow chart showing how the XOR buffer is analyzed in order to control the muting of the output circuit. As shown, when the sequence 0101 (SAME-DIFFERENT-SAME-DIFFERENT) occurs in the XOR buffer, the CDOS counter is incremented by a value (incval) which initially is equal to one. At the same time, the SAME-DIFFERENT-SAME-DIFFERENT counter (sdsdcount) is incremented. When this has occurred three times in a row, sdsdcount will equal three and a flag (Flag1) is set. Once Flag 1 is set, the input SAME-DIFFERENT-SAME-SAME (0100) will cause Flag1 and sdsdcount to reset while setting a new flag (Flag2). At the same time, the CDOS counter is incremented. With Flag2 set, the input 0001 (SAME-SAME-SAME-DIFFERENT) will cause a bit counter (bitcntr) to increment and Flag2 to reset. At this point, the routine shown in FIG. 8 has seen one full data bit without error. If two more data bits are seen without error, this indicates that there is a good possibility that the input is encoded with data. Therefore, when bitcntr is equal to three, the amount by which the CDOS counter is incremented (incval) is incremented and bitcntr is reset. As shown, the value of incval is limited to three. This process continues until the turn on threshold is reached, at which time the output circuit is muted. If the input produces an XOR sequence other than those mentioned, the CDOS counter is reset. The CDOS counter is also reset if the XOR sequence does not agree with the current flag settings. One exception to this is the situation where the sequence 0101 (SAME-DIFFERENT-SAME-DIFFERENT) continues to occur after Flag1 is set. If this occurs, the CDOS counter is still incremented. This is done because in normal data (sequences other than maximum phase shift) this sequence could occur several times in a row. However, if sdsdcount exceeds a certain value, this indicates a pure tone that just happens to be at the frequency of the carrier signal. To avoid sensitivity to such an occurrence, without sacrificing sensitivity to normal data, the CDOS counter is neither incremented nor reset in response to this situation.

The values of the variables used by the improved CDOS could take on a number of values. These variables include the turn on threshold, the number of bits required before incrementing the incremental value, the maximum allowed incremental value of the CDOS counter, and the value of sdsdcount required to neither increment or decrement the CDOS counter. The values chosen to give an optimum performance are those indicated in FIG. 8. Using the values shown in FIG. 8, the fastest that the CDOS of the preferred embodiment can recognize data is 39 msec, or seven bits.

The present invention operates as follows. The present invention may be used in two-way audio communications systems that use PSK digital signals to transmit data packets over a channel that is also used for analog communications. One typical use of such a system is one that provides secure communications by scrambling the transmitted communications. In that example, the channel is used primarily to transmit voice signals. However, data must also be sent along with the voice signals so that the transmitter and receiver will remain synchronized so that descrambling is possible. While a user of such a system is transmitting voice data, occasional data packets will be sent over the same channel. These data packets, as discussed above, typically begin with maximum phase shift data for approximately 20 bits. At the receiver, an encoded PSK data signal is received. The data is sampled at approximately eight times the frequency of the carrier signal using the routines shown in FIG. 6. The present invention alternates between the CDOS routine and a carrier lock routine during the sampling of the data. In the carrier lock routine, alternating addt and subt samples are taken with the subt samples being positioned near the transition point of the carrier signal. The addt samples are taken at approximately half-way between the subt samples. By adding or subtracting time between the current sample and the next sample as described with FIG. 6, a carrier reference signal is generated. During the CDOS routine, an extra sample is taken between each subt and addt samples. From these extra samples, an XOR buffer is created. This XOR buffer is analyzed using the algorithm shown in FIG. 8 to detect the presence of data. When the contents of the XOR buffers are indicative of data, a CDOS counter is incremented. As the contents of the XOR buffer continue to look like data, the amount by which the CDOS counter is incremented is increased. When the CDOS counter reaches a certain threshold, the CDOS turns on and mutes the output circuit. In this way, when the data packets are transmitted, the CDOS receiver quickly determines the presence of the data and mutes the output circuit so that the user of the receiver does not have to listen to the unintelligible data signal.

The CDOS routine shown in FIGS. 6 and 8 is implemented using a 600 Hz lowpass filter, a limiter, and a microprocessor programmed with the flow charts of FIGS. 6 and 8. It is possible to implement the CDOS on a microprocessor along with all the necessary coding and decoding required for a scrambling and descrambling system.

The preferred embodiment of the present invention has been set forth in the drawings and specification, and although specific terms are employed, these are used in a generic or descriptive sense only and are not used for purposes of limitation. Changes in the form and proportion of parts as well as in the substitution of equivalents are contemplated as circumstances may suggest or render expedient without departing from the spirit and scope of the invention as further defined in the following claims.

What is claimed:

1. A method of identifying data in a phase shift keyed digital signal encoded with data comprising the steps of:

taking a first set of samples of the encoded signal each corresponding to a transition point of the encoded signal such that the first set of samples is taken at a frequency of approximately two times the encoded signal frequency;

taking a second set of samples of the encoded signal, the samples of the second set taken at points between successive samples from the first set such that the second set of samples is taken at a frequency of approximately two times the encoded signal frequency;

taking a third set of samples of the encoded signal, each of the samples of the third set of samples corresponding to a point between a sample from the first set and the second set such that the third set of samples is taken at a frequency of approximately four times the encoded signal frequency; and identifying data in the encoded signal based on the third set of samples.

2. The method of claim 1 wherein the step of identifying data further comprises the step of comparing successive samples from the third set of samples to identify the presence of data.

3. The method of claim 2 wherein the five most recent samples from the third set of samples are compared to identify data.

4. The method of claim 1 wherein the step of identifying data further comprises the steps of:

storing the samples from the third set;

comparing at least some of the stored samples with the most recent stored sample; and identifying data in the encoded signal based on the comparison of the stored samples with the most recent stored sample.

5. The method of claim 4 wherein the step of identifying data further comprises the steps of:

providing a counter;

incrementing the counter based on each comparison of samples; and identifying data in the encoded signals based on the counter.

6. The method of claim 1 wherein the step of identifying data further comprises the steps of:

creating a sample buffer for each sample from the third set of samples, wherein the sample buffer contains information relating to the five most recent samples taken from the third set of sample; and creating a comparison buffer corresponding to each sample buffer, wherein the comparison buffer contains information relating to a comparison of the information in the corresponding sample buffer.

7. The method of claim 6 further comprising the step of analyzing each comparison buffer to identify data in the encoded signal.

8. The method of claim 7 wherein the step of analyzing each comparison buffer further comprises the steps of:

for each comparison buffer, determining whether the contents of the comparison buffer are indicative of data;

providing a counter; and incrementing the counter for each comparison buffer that is indicative of data.

9. The method of claim 8 further comprising the step of changing the amount that the counter is incremented based on the contents of a number of consecutive comparison buffers.

10. A method of identifying data in a phase shift keyed digital signal encoded with data on a carrier signal having a carrier frequency comprising the steps of:

sampling the encoded signal at a frequency of approximately eight times the carrier frequency, wherein every fourth sample is taken at an approximate time corresponding to a transition point of the carrier signal; and identifying data in the encoded signals based on the samples taken immediately before and immediately after the samples corresponding to a transition point of the carrier signal.

11. The method of claim 10 wherein the step of identifying data further comprises the steps of:

providing a counter; and incrementing the counter each time the samples taken immediately before and immediately after the samples corresponding to a transition point of the carrier signal are indicative of data.

12. The method of claim 11 wherein data is identified in the encoded signal when the counter reaches a threshold value.

13. The method of claim 11 wherein the amount that the counter is incremented is variable.

14. The method of claim 13 wherein the amount that the counter is incremented is variable depending on the samples.

15. A method of providing improved carrier based data operated squelch for muting an output circuit of a communications receiver during the transmission of data by identifying data in a phase shift keyed digital signal encoded with data on a carrier signal having a carrier frequency comprising the steps of:

sampling the encoded signal at successive times to create a plurality of successive samples of the encoded signal;

creating a plurality of successive sample buffers, each sample buffer containing values for a number of successive samples;

creating a comparison buffer corresponding to each sample buffer, each comparison buffer containing values relating to the comparison of the values in the sample buffer for the successive samples in the corresponding sample buffer;

determining the presence of data in the digital signal based on the contents of the comparison buffer; and muting the output circuit upon the determining presence of data.

16. The method of claim 15 wherein the step of determining the presence of data further comprises the steps of:

determining whether the contents of each comparison buffer are indicative of data;

providing a counter;

incrementing the counter each time that it is determined that the contents of one of the comparison buffers is indicative of data; and determining the presence of data based on the value of the counter.

17. The method of claim 16 wherein the output circuit is muted when the counter reaches a threshold value.

* * * * *